United States Patent
Hendrickson

(10) Patent No.: US 9,177,672 B2
(45) Date of Patent: Nov. 3, 2015

(54) METHODS OF OPERATING MEMORY INVOLVING IDENTIFIERS INDICATING REPAIR OF A MEMORY CELL

(71) Applicant: MICRON TECHNOLOGY, INC., Boise, ID (US)

(72) Inventor: Nicholas Hendrickson, Rancho Cordova, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 14/700,292

(22) Filed: Apr. 30, 2015

(65) Prior Publication Data

US 2015/0262716 A1    Sep. 17, 2015

Related U.S. Application Data

(63) Continuation of application No. 13/483,407, filed on May 30, 2012, now Pat. No. 9,043,661.

(51) Int. Cl.
| | |
|---|---|
| *G11C 29/00* | (2006.01) |
| *G11C 16/08* | (2006.01) |
| *G11C 16/14* | (2006.01) |
| *G11C 16/28* | (2006.01) |
| *G06F 11/10* | (2006.01) |

(52) U.S. Cl.
CPC ............... *G11C 29/70* (2013.01); *G11C 16/08* (2013.01); *G11C 16/14* (2013.01); *G11C 16/28* (2013.01); *G06F 11/1048* (2013.01)

(58) Field of Classification Search
CPC ........ G11C 29/70; G11C 16/08; G11C 16/14; G11C 16/28; G06F 11/1048; G06F 11/08
USPC .......... 714/711, 710, 718, 723, 6.1, 6.13, 6.2, 714/6.32; 365/200, 201, 218, 185.09, 365/185.14, 185.29
See application file for complete search history.

(56) References Cited

U.S. PATENT DOCUMENTS

| | | |
|---|---|---|
| 4,584,681 A | 4/1986 | Singh et al. |
| 6,011,733 A | 1/2000 | Fischer et al. |
| 6,407,944 B1 | 6/2002 | Choi et al. |
| 6,532,181 B2 | 3/2003 | Saito et al. |
| 6,944,072 B2 | 9/2005 | Micheloni et al. |
| 7,447,066 B2 | 11/2008 | Conley et al. |
| 7,619,938 B2 | 11/2009 | Co et al. |
| 8,072,802 B2 * | 12/2011 | Kikuchi et al. ........... 365/185.03 |
| 8,832,527 B2 * | 9/2014 | Cheng ............................ 714/763 |
| 2003/0012066 A1 | 1/2003 | Poechmueller |
| 2010/0002530 A1 * | 1/2010 | Blodgett ....................... 365/200 |
| 2010/0211853 A1 | 8/2010 | Madan et al. |
| 2014/0063953 A1 | 3/2014 | Sakurai et al. |

\* cited by examiner

*Primary Examiner* — Christine Tu
(74) *Attorney, Agent, or Firm* — Dicke, Billig & Czaja, PLLC

(57) ABSTRACT

Method of operating memory including storing and/or using an identifier indicating repair of a memory cell.

20 Claims, 4 Drawing Sheets

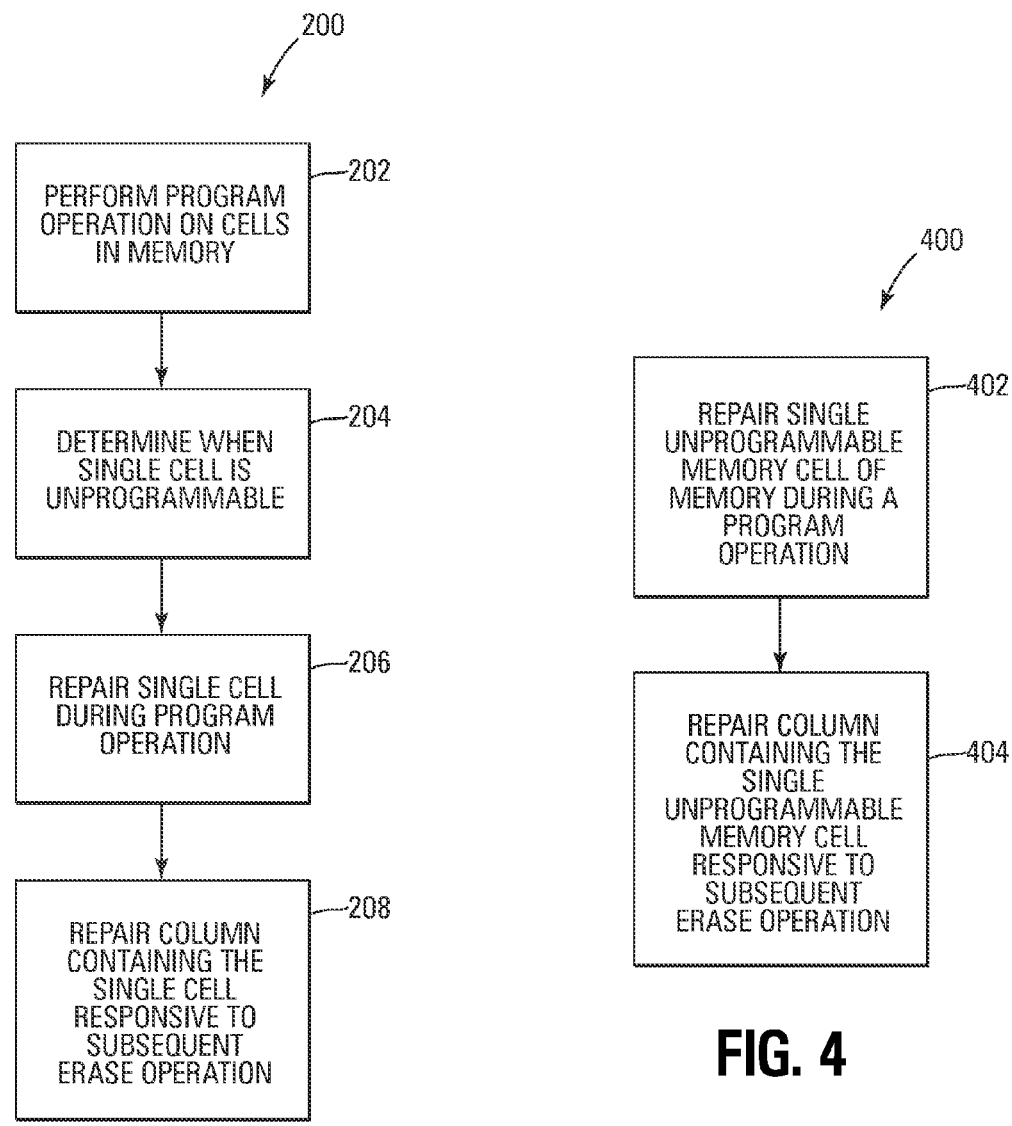

METHODS OF OPERATING MEMORY INVOLVING IDENTIFIERS INDICATING REPAIR OF A MEMORY CELL

RELATED APPLICATION

This application is a continuation of U.S. patent application Ser. No. 13/483,407, titled "MEMORIES AND METHODS FOR PERFORMING COLUMN REPAIR," filed May 30, 2012 (allowed), which is commonly assigned and incorporated herein by reference in its entirety.

FIELD

The present disclosure relates generally to semiconductor memory, and in particular, the present disclosure relates to performing column repair in memories.

BACKGROUND

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the cells, through programming of charge storage structures (e.g., floating gates or charge traps) or other physical phenomena, determine the data value of each cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A Flash memory can be erased and reprogrammed in blocks instead of one byte at a time. A typical Flash memory comprises a memory array, which includes a large number of memory cells. Each of the memory cells includes a floating gate field-effect transistor capable of holding a charge. The data in a cell is determined by the presence or absence of the charge in the charge storage structure. The cells are usually grouped into sections called "erase blocks." The memory cells of a Flash memory array are typically arranged into a "NOR" architecture (the cells arranged in an array of rows and columns, each cell directly coupled to a bit line) or a "NAND" architecture (cells coupled into "strings" of cells, such that each cell is coupled indirectly to a bit line and requires activating the other cells of the string for access). Each of the cells within an erase block can be electrically programmed charging the floating gate (or other charge storage structure.) The charge can be removed from the floating gate by a block erase operation, wherein all memory cells in the erase block are erased in a single operation. Other types of non-volatile memory include, but are not limited to, Polymer Memory, Ferroelectric Random Access Memory (FeRAM), Ovionics Unified Memory (OUM), Nitride Read Only Memory (NROM), Carbon Nanotube memory, Magnetoresistive Random Access Memory (MRAM) and phase change memory (PCM).

NOR architecture memories may have problems if a single cell in a column becomes unprogrammable (e.g., a cell that has been determined to have failed, and/or has otherwise become bad, unreliable, faulty, etc.) Specifically, a single unprogrammable cell in a column in a NOR memory can be leaky and affect the entire column. Repair of an entire column during a program operation can take longer than the low program latency of the operation allows, leading to problems with speed of operation.

For the reasons stated above, and for other reasons which will become apparent to those skilled in the art upon reading and understanding the present specification, there is a need in the art for performing column repair in memories.

BRIEF DESCRIPTION OF DRAWINGS

FIG. 2 is a flow chart diagram of a method according to an embodiment of the present disclosure;

FIG. 4 is a flow chart diagram of a method according to another embodiment of the present disclosure;

DETAILED DESCRIPTION

In the following detailed description of the present embodiments, reference is made to the accompanying drawings that form a part hereof, and in which is shown by way of illustration specific embodiments in which the embodiments may be practiced. These embodiments are described in sufficient detail to enable those skilled in the art to practice the invention, and it is to be understood that other embodiments may be utilized and that process, electrical or mechanical changes may be made without departing from the scope of the present disclosure. The following detailed description is, therefore, not to be taken in a limiting sense.

In memory architectures, cells can eventually become unprogrammable, over time and for other reasons. Cells typically become unprogrammable during either an erase operation or a program operation. When a cell becomes unprogrammable during a program operation, the low latency of typical program operations generally precludes repair of an entire (e.g., full) column that contains the cell without interrupting the flow of programming. If a cell become unprogrammable during an erase operation, the longer latency generally allows for repair of an entire column without affecting the operation or further operations of the memory. Accordingly, in one or more embodiments, single unprogrammable cells are repaired during program operations, and column repairs are performed responsive to a subsequent erase operation.

Figure 1:
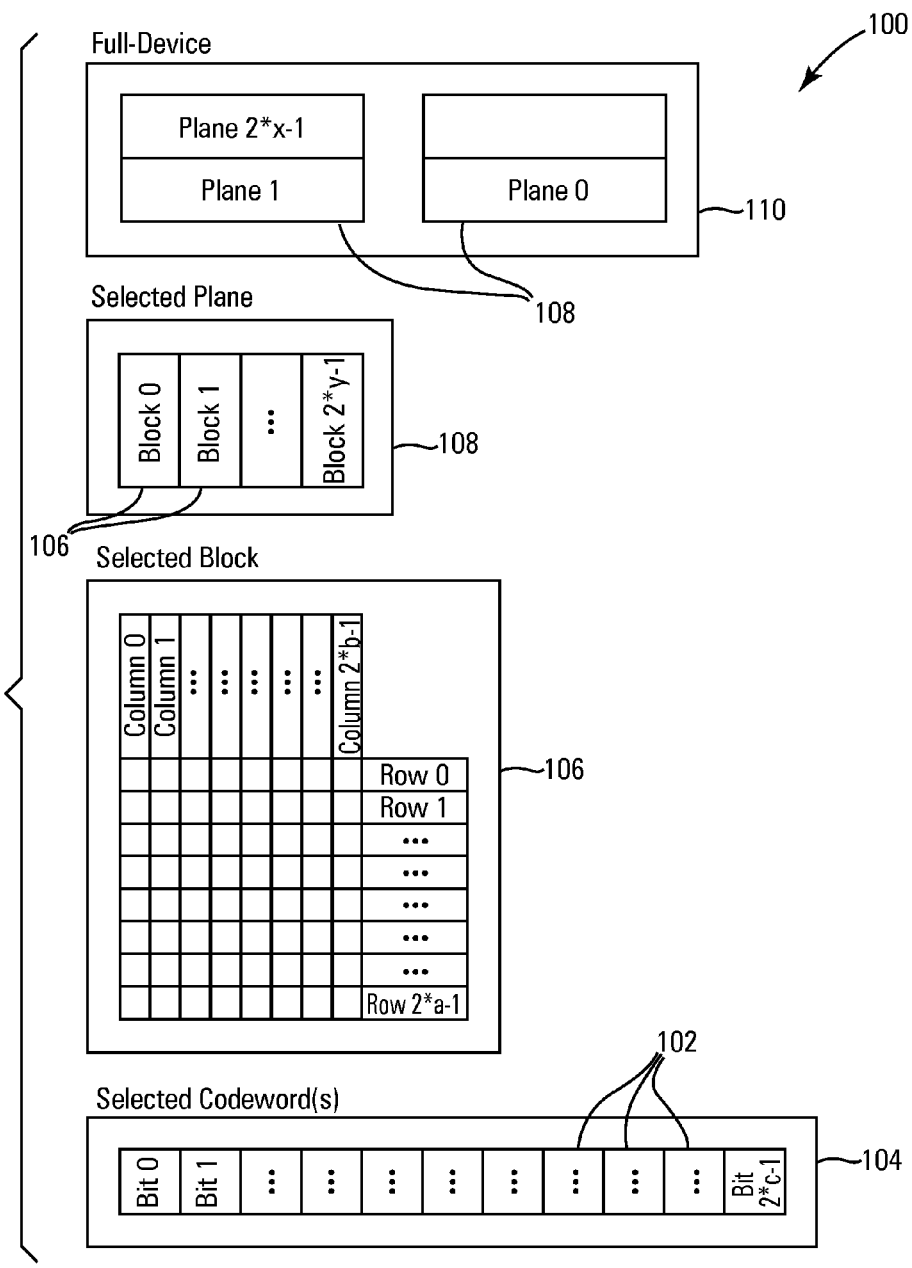
FIG. 1 is a block diagram of a memory on which embodiments of the present disclosure may be practiced.

In the present disclosure, a memory device embodiment 100 is shown in FIG. 1. Memory device comprises in one embodiment a number of cells 102 making up a codeword 104, a number of codewords 104 making up a block 106, a number of blocks 106 making up a plane 108, and a number of planes 108 making up a device 110. So, for any particular codeword, the codeword may span multiple columns within a block, but be contained within one row. Although this configuration of a memory is described, it should be understood that other arrangements of memory devices and memory arrays may be used without departing from the scope of the disclosure.

One embodiment of a method 200 of operating a memory is shown in flow chart form in FIG. 2. The method 200 comprises performing a program operation on cells in the memory in block 202, determining when a single cell is unprogrammable in block 204, repairing the single cell during a program operation in block 206, and repairing a column containing the single cell responsive to a subsequent erase operation (e.g., a subsequent erase cycle) in block 208, wherein replacing a cell, such as by remapping its address to another cell, is an example of repairing a cell. Replacing may be done, for example, by copying the data of the column to be replaced to a redundant column, and then remapping the address of the column to be replaced to the redundant column. Repairing the single cell in one embodiment is performed by storing an identifier of the cell, and programming target data for the single cell into a redundant location (e.g., a cell of a redundant column, a redundant column, etc.) In one or more embodiments, the identifier may be stored in, for example, a repair register, table, or the like.

Figure 3:
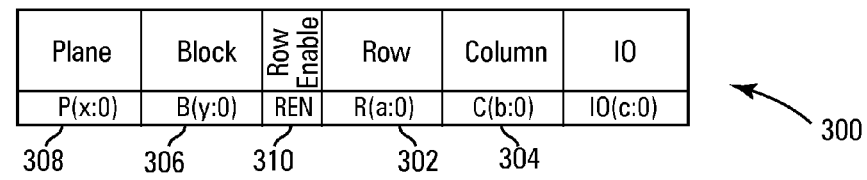
FIG. 3 is a block diagram of an identifier according to an embodiment of the present disclosure.

An identifier 300 for cells that have become unprogrammable is shown in FIG. 3 and includes in one embodiment an indicator (e.g., address) of a row 302, a column 304, block 306, and plane 308 for the cell. In further embodiments, the identifier also may include a row enable indicator 310. A row enable indicator 310 comprises, in one embodiment, a single row enable bit, e.g., a 1 or 0. The row enable indicator 310 is used to determine whether the row address 302 is used (with row enable indicator 1) or masked (with row enable indicator 0) during address matching using the identifier 300. When the row address 302 is used for address matching, then the identifier 300 identifies one cell of the memory, by its row address 302, column address 304, block 306, and plane 308 of the memory. When the row address 302 is masked, only the column address 304, block 306, and plane 308 are used for address matching. This identifies columns of the memory as opposed to individual cells. Entire column repair is performed at a subsequent erase operation after individual cell repair is performed during a program operation in one or more embodiment since unprogrammable cells may eventually cause an entire column to become unprogrammable if even one cell of the column is unprogrammable.

Repairing a column in the method comprises, in one embodiment, when a row enable indicator is set in an identifier for a single unprogrammable cell, replacing an entire column of cells containing the single unprogrammable cell, and clearing the row enable indicator. Single cell repair is performed during a program operation. In one embodiment, upon repair of a single cell, the identifier for the cell is stored in a table with the row enable indicator set (e.g., a logic 1) for the identifier. The set row enable indicator indicates that the row address is to be used during address matching. When the row enable indicator is set (logic 1), upon a read operation, the identifiers are checked, and if the row address, column address, block, and plane match, the cell identified is an unprogrammable cell that has been repaired in a single cell repair, and a replacement address is provided for reading the contents of that cell.

Responsive to initiating a subsequent erase operation, the identifiers for blocks subject to the erase operation are read, and column repair is effected for unprogrammable cells as follows. When the row enable indicator for unprogammed cell is set in an identifier for that cell, the entire column of cells based on the column address, block, and plane of the identifier is replaced in a column replacement operation. When the replacement has been completed, the row enable indicator is reset to logic 0, e.g., cleared.

Another method 400 of repairing a memory is shown in FIG. 4. Method 400 comprises, in one embodiment, repairing a single, unprogrammable memory cell in the memory during a program operation in block 402, and repairing a column containing the single, unprogrammable memory cell responsive to a subsequent erase operation in block 404. Repairing a memory cell comprises, in one embodiment, storing an identifier of the cell, and programming target data for the unprogrammable cell into a redundant location. The identifier for the cell in one embodiment is consistent with the identifier 300 described above.

Repairing a column containing an unprogrammable memory cell in one embodiment comprises replacing an entire column of memory cells containing the unprogrammable memory cell. In the method 400, row address matching is performed by setting (e.g., at logic 1) a row enable indicator (e.g., a row enable bit) that enables single cell repair. Responsive to initiating a subsequent erase operation, columns containing an unprogrammable single cell are repaired, and the row enable indicator in the identifier for such a cell is reset (e.g., to logic 0). This masks the row address matching requirement, so that only the column address, block, and plane are used in address matching for subsequent attempts to access the column including that unprogrammable cell.

In a program operation, a plurality of program pulses are applied to the cells to be programmed, each program pulse followed by a verify pulse to verify that the cells have programmed to the desired threshold voltage. After a certain number of program/verify pulses, a cell or cells may fail to reliably program. When this happens, the cell or cells are determined (e.g., identified) to be unprogrammable. An "unprogrammable" cell may read as a 1 or a 0, but it should not be relied upon. At this point, there may be data in up to all of the remaining cells of the column (in one embodiment 255). In the worst case, there is data in all cells of the column, and a repair at this point during the program operation may require up to 255 cell replacements. This often takes time more than the program latency of memory devices allows.

Within a block, typical memory devices have redundant sets of columns. When a cell is determined to be unprogrammable, if a redundant column is available, the data that was to be programmed to the unprogrammable cell is written to a cell in one of the redundant columns. An identifier of the unprogrammable cell is stored, in one embodiment, as a repair entry in a table, including the row address, column address, block, and plane of the unprogrammable cell, along with a row enable indicator, such as a table of identifiers like identifier 300 described above. Each row enable identifier in one embodiment is preset to allow single cell repair by requiring row address matching. Programming is completed. When reading of the memory occurs, and an address of a cell is provided, the table is consulted to determine if the address is that of an unprogrammable cell. If it is, the redundant single cell entry is read instead.

NAND and NOR memory cells typically only change data state once without erasing. Responsive to initiating an erase operation, the single cell repairs of unprogrammable cells are converted to entire column repairs. This is accomplished in one embodiment by checking the table for entries of unprogrammable cells, and clearing the row enable indicator. The clearing of the row enable indicator masks the row address matching requirement, so that after an erase operation, the repair is converted to column repair for subsequent programming and read operations.

Figure 5:
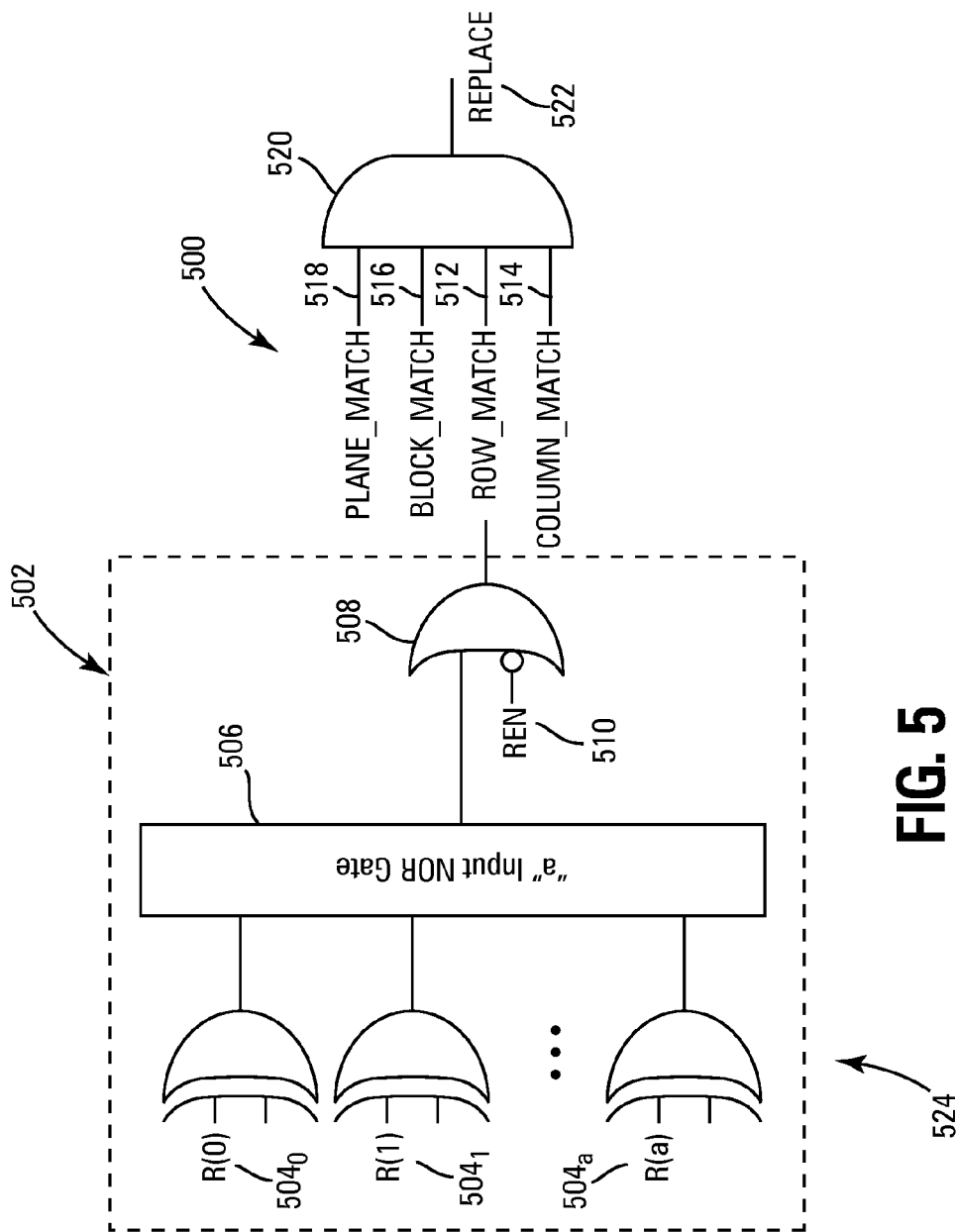
FIG. 5 is a circuit diagram of a circuit according to an embodiment of the present disclosure.

One embodiment of circuitry 500 for address matching is shown in FIG. 5. Address matching circuitry 500 comprises in one embodiment a row matching element 502 and an AND gate 520. Row matching element 502 receives row addresses $504_0, 504_1, \ldots 504_a$, which are combined in NOR gate 506. The output of NOR gate 506 is combined in OR gate 508 with the complement of the row enable indicator to generate a row match signal 512. Row match signal 512 is combined in AND gate 520 with column match signal 514, block match signal 516, and plane match signal 518. The output 522 of AND gate 520 is used to determine whether to replace or not replace a cell associated with the row address, column address, block, and plane. XOR gates 524 have as a first input the row address, each bit of the row address as an input to one XOR gate 524, and as a second input a stored row address to be matched (e.g., a row address stored in a fuse/anti-fuse/NOR array/register storing a row address to be matched), each bit of the stored row address to be matched as an input to one XOR gate 524. XOR gates 524 are used therefore, in one embodiment, for bit-by-bit matching of a row address, wherein each XOR gate 524 only outputs a 0 if its respective bit is matched. In one embodiment, there is a unique set of matching devices per repair record in the device, so for each repair it is the register plus the XOR gates. The XOR gates and storage for a row address to be matched is used with the circuitry generally used for column addressing. However, adding row matching allows for repair of a single bit.

In one embodiment, the initial result of row address matching at the output of NOR gate 506 is combined in an OR gate 508 with the complement of the row enable indicator 510. If the row enable indicator is logic 0 (e.g., cleared), then the row match signal 512 will be a logic 1, regardless of whether the row address is actually matched. If the row enable indicator is logic 1 (e.g., set), then the row match signal 512 will be a logic 1 only when a row match is indicated at the output of NOR gate 506. A row enable indicator of 1 will match on the actual row address, whereas a row enable indicator of 0 will mask out the row address and always return a row match. When each of the signals row match 512, column match 514, block match 516, and plane match 518 are logic 1, a redundant location is accessed instead of a location indicated by the received address.

Figure 6:
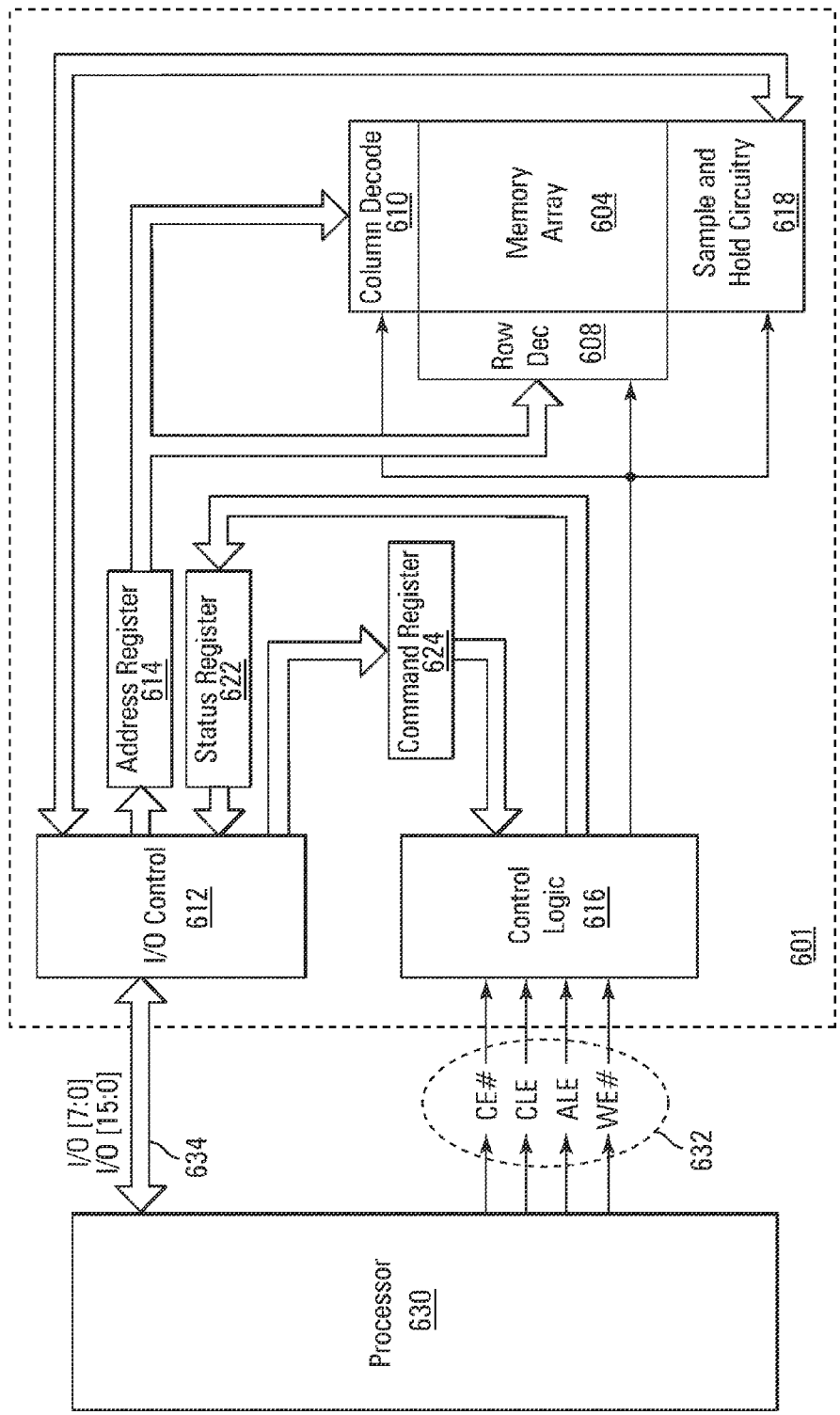
FIG. 6 is a block schematic of an electronic system in accordance with an embodiment of the disclosure.

FIG. 6 is a simplified block diagram of a memory device 601 according to an embodiment of the disclosure, and on which various embodiments of the disclosure can be practiced. Memory device 601 includes an array of memory cells 604 arranged in rows and columns. Although the various embodiments will be described primarily with reference to NAND memory arrays, the various embodiments are not limited to a specific architecture of the memory array 604. Some examples of other array architectures suitable for the present embodiments include NOR arrays, AND arrays, and virtual ground arrays. Further, the embodiments described herein are amenable for use with SLC and MLC memories without departing from the scope of the disclosure. Also, the methods are applicable for memories which could be read/sensed in analog format.

Row decode circuitry 608 and column decode circuitry 610 are provided to decode address signals provided to the memory device 601, and may include matching circuitry such as circuitry 500 described above. Address signals are received and decoded to access memory array 604. Memory device 601 also includes input/output (I/O) control circuitry 612 to manage input of commands, addresses and data to the memory device 601 as well as output of data and status information from the memory device 601. An address register 614 is coupled between I/O control circuitry 612 and row decode circuitry 608 and column decode circuitry 610 to latch the address signals prior to decoding. A command register 624 is coupled between I/O control circuitry 612 and control logic 616 to latch incoming commands. In one embodiment, control logic 616, control circuitry 612 and/or firmware or other circuitry can individually, in combination, or in combination with other elements, form an internal controller. As used herein, however, a controller need not necessarily include any or all of such components. In some embodiments, a controller can comprise an internal controller (e.g., located on the same die as the memory array) and/or an external controller. Control logic 616 controls access to the memory array 604 in response to the commands and generates status information for an external controller such as a processor 630. The control logic 616 is coupled to row decode circuitry 608 and column decode circuitry 610 to control the row decode circuitry 608 and column decode circuitry 610 in response to the addresses.

A status register 622 is coupled between I/O control circuitry 612 and control logic 616 to latch the status information for output to an external controller.

Memory device 601 receives control signals at control logic 616 over a control link 632. The control signals may include a chip enable CE#, a command latch enable CLE, an address latch enable ALE, and a write enable WE#. Memory device 601 may receive commands (in the form of command signals), addresses (in the form of address signals), and data (in the form of data signals) from an external controller over a multiplexed input/output (I/O) bus 634 and output data to an external controller over I/O bus 634.

In a specific example, commands are received over input/output (I/O) pins [7:0] of I/O bus 634 at I/O control circuitry 612 and are written into command register 624. The addresses are received over input/output (I/O) pins [7:0] of bus 634 at I/O control circuitry 612 and are written into address register 614. The data may be received over input/output (I/O) pins [7:0] for a device capable of receiving eight parallel signals, or input/output (I/O) pins [15:0] for a device capable of receiving sixteen parallel signals, at I/O control circuitry 612 and are transferred to sample and hold circuitry 618. Data also may be output over input/output (I/O) pins [7:0] for a device capable of transmitting eight parallel signals or input/output (I/O) pins [15:0] for a device capable of transmitting sixteen parallel signals. It will be appreciated by those skilled in the art that additional circuitry and signals can be provided, and that the memory device of FIG. 6 has been simplified to help focus on the embodiments of the disclosure.

Methods for repair of single cells on programming and entire columns on erasing may be performed in various embodiments on a memory such as memory 600. Matching circuitry such as circuitry 500 may, in one embodiment, be a part of row and column decode circuitry 608, 610, or may, in another embodiment, be separate circuitry operable with row and column decode circuitry, without departing from the scope of the disclosure. Such methods are shown and described herein with reference to FIGS. 1-5.

Additionally, while the memory device of FIG. 6 has been described in accordance with popular conventions for receipt and output of the various signals, it is noted that the various embodiments are not limited by the specific signals and I/O configurations described. For example, command and address signals could be received at inputs separate from those receiving the data signals, or data signals could be transmitted serially over a single I/O line of I/O bus 634. Because the data signals represent bit patterns instead of individual bits, serial communication of an 8-bit data signal could be as efficient as parallel communication of eight signals representing individual bits.

Memories and methods of operating memories have been described that include, for example, repair faulty memory cells on a cell by cell basis during a program operation, and repair columns associated with faulty memory cells on a subsequent erase operation. A row enable indicator is used to mask or unmask row addresses for single cell or full column repair.

Although specific embodiments have been illustrated and described herein, it will be appreciated by those of ordinary skill in the art that any arrangement that is calculated to achieve the same purpose may be substituted for the specific embodiments shown. Many adaptations of the disclosure will be apparent to those of ordinary skill in the art. Accordingly, this application is intended to cover any adaptations or variations of the disclosure.

What is claimed is:

1. A method of operating a memory, comprising:
in response to a read operation of a particular address for a particular memory cell, checking a stored identifier comprising a plurality of address portions collectively representing an address of a corresponding memory cell and an enable indicator for a particular address portion of the plurality of address portions and indicating repair of the memory cell corresponding to the identifier;
if the enable indicator has a first value, reading a redundant memory cell instead of the particular memory cell when each address portion of the plurality of address portions matches a corresponding portion of the particular address; and
if the enable indicator has a second value different than the first value, reading a redundant memory cell instead of the particular memory cell when each address portion of the plurality of address portions other than the particular portion matches a corresponding portion of the particular address.

2. The method of claim 1, wherein reading a redundant memory cell instead of the particular memory cell when each address portion of the plurality of address portions other than the particular portion matches a corresponding portion of the particular address comprises reading the redundant memory cell instead of the particular memory cell when each portion of the particular address other than a row address portion of the particular address is matched.

3. The method of claim 1, wherein checking a stored identifier comprising a plurality of address portions collectively representing an address of a corresponding memory cell comprises checking the stored identifier comprising a plane address, a block address, a column address and a row address of the corresponding memory cell.

4. The method of claim 3, wherein reading a redundant memory cell instead of the particular memory cell when each address portion of the plurality of address portions other than the particular portion matches a corresponding portion of the particular address comprises reading the redundant memory cell instead of the particular memory cell when the plane address, the block address and the column address of the stored identifier each match a corresponding portion of the particular address.

5. The method of claim 1, wherein reading a redundant memory cell instead of the particular memory cell when each address portion of the plurality of address portions other than the particular portion matches a corresponding portion of the particular address comprises reading a redundant memory cell for any address corresponding to a memory cell in a column of memory cells containing the particular memory cell.

6. The method of claim 1, wherein reading a redundant memory cell instead of the particular memory cell when each address portion of the plurality of address portions matches a corresponding portion of the particular address comprises reading the redundant memory cell instead of the particular memory cell when the particular address is the address of the memory cell corresponding to the stored identifier.

7. A method of operating a memory, comprising:
performing a program operation on a particular memory cell, and if the particular memory cell is deemed to be unprogrammable during the program operation, repairing the particular memory cell and storing an identifier corresponding to the particular memory cell and indicating that the particular memory cell has been repaired;
initiating an erase operation on a group of memory cells containing the particular memory cell;
reading the identifier in response to initiating the erase operation on the group of memory cells; and
if a portion of the identifier has a particular value, storing a different value to the portion of the identifier.

8. The method of claim 7, wherein storing an identifier corresponding to the particular memory cell and indicating that the particular memory cell has been repaired comprises storing the identifier such that the portion of the identifier has the particular value indicating repair of only the particular memory cell.

9. The method of claim 8, wherein storing a different value to the portion of the identifier comprises storing a value indicating repair of a plurality of memory cells containing the particular memory cell.

10. The method of claim 9, wherein storing a value indicating repair of a plurality of memory cells containing the particular memory cell comprises storing a value indicating repair of a column of memory cells containing the particular memory cell.

11. The method of claim 10, wherein initiating an erase operation on a group of memory cells comprises initiating the erase operation on a block of memory cells.

12. The method of claim 7, wherein repair of the particular memory cell comprise programming target data for the particular memory cell into a redundant memory cell.

13. The method of claim 7, wherein initiating an erase operation comprises an erase operation that is the next subsequent erase operation following the program operation.

14. The method of claim 7, wherein storing a different value to the portion of the identifier if the portion of the identifier has a particular value comprises storing a logical 0 value to the portion of the identifier if the portion of the identifier has a logical 1 value.

15. The method of claim 7, wherein storing an identifier corresponding to the particular memory cell comprises storing the identifier comprising a plurality of address portions collectively representing an address of the particular memory cell, and wherein the portion of the identifier corresponds to a particular portion of the plurality of address portions.

16. The method of claim 15, further comprising:
in response to a read operation of a particular address of a corresponding memory cell, checking the stored identifier;
if the portion of the identifier has the particular value, reading a redundant memory cell instead of the memory cell corresponding to the particular address when each address portion of the plurality of address portions matches a corresponding portion of the particular address; and
if the portion of the identifier has the different value, reading a redundant memory cell instead of the memory cell corresponding to the particular address when each address portion of the plurality of address portions other than the particular portion matches a corresponding portion of the particular address.

17. A method of operating a memory, comprising:
performing a program operation on a particular memory cell, and if the particular memory cell is deemed to be unprogrammable during the program operation, repairing the particular memory cell and storing an identifier comprising a plurality of address portions collectively representing an address of the particular memory cell and an enable indicator for a particular address portion of the plurality of address portions and indicating that the particular memory cell has been repaired;
initiating an erase operation on a group of memory cells containing the particular memory cell;
reading the identifier in response to initiating the erase operation on the group of memory cells and if the enable indicator has a particular value, storing a different value to the enable indicator;
initiating a read operation of a particular address of a corresponding memory cell;
checking the stored identifier in response to initiating the read operation;
if the enable indictor has the particular value, reading a redundant memory cell instead of the memory cell corresponding to the particular address when each address portion of the plurality of address portions matches a corresponding portion of the particular address; and
if the enable indicator has the different value, reading a redundant memory cell instead of the memory cell corresponding to the particular address when each address portion of the plurality of address portions other than the particular portion matches a corresponding portion of the particular address.

18. The method of claim 17, wherein reading a redundant memory cell instead of the memory cell corresponding to the particular address when each address portion of the plurality of address portions other than the particular portion matches a corresponding portion of the particular address comprises reading a redundant memory cell for any address corresponding to a memory cell in a column of memory cells containing the particular memory cell.

19. The method of claim 17, wherein reading a redundant memory cell instead of the memory cell corresponding to the particular address when each address portion of the plurality of address portions other than the particular portion matches a corresponding portion of the particular address comprises reading the redundant memory cell instead of the memory cell corresponding to the particular address when the particular address is the address of the particular memory cell.

20. The method of claim 17, wherein initiating the read operation occurs before initiating the erase operation.

* * * * *